United States Patent
Ito et al.

(10) Patent No.: US 10,531,601 B2
(45) Date of Patent: Jan. 7, 2020

(54) COMPONENT PICKUP POSITION CORRECTION SYSTEM AND COMPONENT PICKUP POSITION CORRECTION METHOD FOR A ROTARY HEAD TYPE COMPONENT MOUNTER

(71) Applicant: FUJI CORPORATION, Chiryu-shi (JP)

(72) Inventors: Hidetoshi Ito, Okazaki (JP); Jun Iisaka, Nisshin (JP)

(73) Assignee: FUJI CORPORATION, Chiryu-shi (JP)

( * ) Notice: Subject to any disclaimer, the term of this patent is extended or adjusted under 35 U.S.C. 154(b) by 362 days.

(21) Appl. No.: 15/517,410

(22) PCT Filed: Oct. 20, 2014

(86) PCT No.: PCT/JP2014/077825
§ 371 (c)(1),
(2) Date: Apr. 6, 2017

(87) PCT Pub. No.: WO2016/063328
PCT Pub. Date: Apr. 28, 2016

(65) Prior Publication Data
US 2017/0311493 A1 Oct. 26, 2017

(51) Int. Cl.
*H05K 13/04* (2006.01)
*H05K 13/02* (2006.01)

(52) U.S. Cl.
CPC ....... *H05K 13/0408* (2013.01); *H05K 13/041* (2018.08); *H05K 13/0413* (2013.01);
(Continued)

(58) Field of Classification Search
CPC .... H05K 13/02; H05K 13/04; H05K 13/0404; H05K 13/0406; H05K 13/0408;
(Continued)

(56) References Cited

U.S. PATENT DOCUMENTS 6,154,954 A 12/2000 Seto et al.
6,694,606 B1 * 2/2004 Ohashi ............... H05K 13/0417
29/740
(Continued)

FOREIGN PATENT DOCUMENTS

CN 1784141 A 6/2006
CN 101340809 A 1/2009
(Continued)

OTHER PUBLICATIONS

Machine translation of JP 2009272651 provided by EPO website (Espacenet.com) (Year: 2019).*
(Continued)

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

In a rotary head type component mounter, before using two suction nozzles of rotary head to pick up the leading components in component supply tape set in two tape feeders, rotary head is moved in the XY directions by head moving mechanism and rotated by head rotating mechanism such that the pickup points of the two suction nozzles are positioned on two straight lines and extending in the tape feeding direction of each tape feeder passing through the ideal pickup points of the leading components of the two tape feeders, and the leading components are fed to component pickup positions and that are the pickup points of the suction nozzles on the two straight lines. Then, the two suction nozzles of rotary head are lowered simultaneously to pick up the two component simultaneously using the two suction nozzles.

5 Claims, 7 Drawing Sheets

(52) U.S. Cl.
    CPC .... *H05K 13/0417* (2013.01); *Y10T 29/49137* (2015.01); *Y10T 29/53174* (2015.01); *Y10T 29/53191* (2015.01)

(58) Field of Classification Search
    CPC ............ H05K 13/0409; H05K 13/041; H05K 13/043; H05K 13/0417; H05K 13/081; H05K 13/0812; Y10T 29/4913; Y10T 29/49131; Y10T 29/49133; Y10T 29/49137; Y10T 29/5313; Y10T 29/53174; Y10T 29/53178; Y10T 29/53191
    See application file for complete search history.

(56) References Cited

U.S. PATENT DOCUMENTS

| | | | |
|---|---|---|---|
| 6,986,196 B2 * | 1/2006 | Terui | H05K 13/0417 29/740 |
| 2006/0112545 A1 | 6/2006 | Hwang | |

FOREIGN PATENT DOCUMENTS

| | | |
|---|---|---|
| EP | 0 821 549 A2 | 1/1998 |
| EP | 2 012 576 A2 | 1/2009 |
| JP | 9-270595 A | 10/1997 |
| JP | 2585918 Y2 | 11/1998 |
| JP | 2009-272651 A | 11/2009 |
| JP | 4860270 B2 | 1/2012 |
| JP | 2012-164881 A | 8/2012 |
| JP | 2013-38358 A | 2/2013 |

OTHER PUBLICATIONS

Extended European Search Report dated May 2, 2018 in Patent Application No. 14904313.5, 8 pages.
Office Action dated Jul. 31, 2018 in Japanese Patent Application No. 2016-554959, with English translation.
International Search Report dated Dec. 9, 2014 in PCT/JP2014/077825 filed Oct. 20, 2014.

* cited by examiner

COMPONENT PICKUP POSITION CORRECTION SYSTEM AND COMPONENT PICKUP POSITION CORRECTION METHOD FOR A ROTARY HEAD TYPE COMPONENT MOUNTER

TECHNICAL FIELD

The present application relates to a component pickup position correction system and component pickup position correction method for a rotary head type component mounter provided with a function that corrects the position at which to pick up a component that is supplied by a tape feeder.

BACKGROUND ART

When a component mounter picks up a component supplied from a tape feeder with a suction nozzle, if the component pickup position is deviated, pickup errors and the like are more likely to occur, making it necessary to perform correction to align the position of the suction nozzle with the position of the next component to pick up. Thus, conventionally, correction is performed to align the position of the suction nozzle with the position of the next component to pick up (a target component pickup position) by moving the mounting head that holds the suction nozzles in the XY directions (left-right and front-rear directions).

Further, with a rotary head type component mounter, as disclosed in patent literature 1 (JP-A-H9-270595), the position of the next component to pick up is recognized by imaging that component with a component recognition camera and performing image processing, and then, based on the recognized position, the position of the suction nozzle is corrected by slightly rotating the rotary head that holds the suction nozzle.

Also, as disclosed in patent literature 2 (JP-A-2012-164881), to improve productivity, a Z-axis drive mechanism that lowers multiple of the suction nozzles is provided on the rotary head, and pickup of multiple components is performed simultaneously by lowering multiple suction nozzles simultaneously.

CITATION LIST

Patent Literature

Patent literature 1: JP-A-H9-270595
Patent literature 2: JP-A-2012-164881

SUMMARY OF INVENTION

Technical Problem

However, even when picking up multiple components simultaneously by lowering multiple suction nozzles simultaneously as in patent literature 2, to prevent pickup errors and the like, it is desirable to perform correction of the deviation of the component pickup position for each component. Here, one may consider applying the component pickup correction technology of patent literature 1 to the rotary head type component mounter of patent literature 2, that is, recognizing the positions of the next multiple components to pick up by imaging those components with a component recognition camera and performing image processing, then rotating the rotary head slightly based on the positions of the multiple components, thus correcting the positions of the multiple nozzles that pick up the multiple components.

However, the deviation of the component pickup position is not uniform for multiple components, with the deviation direction and the deviation amount being unrelated; thus, with the component pickup correction method of patent literature 1, it is not possible to correct the deviation of multiple component pickup positions simultaneously. Therefore, if the deviation amount of the component pickup position of multiple components exceeds a tolerance amount beyond which stable pickup is not possible, it is difficult to perform simultaneous pickup of multiple components, meaning that components must be picked up one by one and the component pickup positions corrected one by one, meaning that productivity cannot be improved.

Thus, an object of the present disclosure is to simultaneously pick up two components fed to two component pickup positions.

Solution to Problem

To solve the above problems, the present disclosure is a component pickup position correction method of a rotary head type component mounter, the method including: feeding a component stored in component supply tape to a component pickup position by performing feeding operation of the component supply tape using multiple tape feeders; holding multiple suction nozzles at a specified interval in a circumferential direction on a rotary head; revolving the multiple suction nozzles in the rotation direction of the rotary head by rotating the rotary head using a head rotating mechanism; using a Z-axis drive mechanism to pick up the component by lowering the suction nozzle that is positioned above the component pickup position of one of the multiple tape feeders; using a head moving mechanism to move the rotary head in the XY directions between a component pickup station at which component pickup operation is performed and a component mounting station at which component mounting operation is performed, using the Z-axis drive mechanism, which is provided in two locations, to cause simultaneous pickup of the leading components in two of the tape feeders by simultaneously lowering the two suction nozzles that are positioned above the component pickup positions of two of the multiple tape feeders, and, when correcting the component pickup positions of the leading components of the two tape feeders to be picked up, moving the rotary head in the XY directions using the head moving mechanism such that the pickup points of the two suction nozzles are positioned on two straight lines extending in the tape feeding direction of each tape feeder passing through an ideal pickup point of the leading components of the two tape feeders, rotating the rotary head using the head rotating mechanism, and feeding the leading components to the component pickup positions that are the pickup points of the suction nozzles on the two straight lines by performing tape feeding operation of the two tape feeders. Here, an ideal pickup point of a component is generally considered to be the center of the component or the center of gravity of the component, which is a pickup point at which the component can be picked up stably by a suction nozzle.

Even in cases in which the positions of the leading components in component supply tape set in two tape feeders are deviated, or in which the positions of two suction nozzles used to pick up those components are deviated, with the present disclosure, because the rotary head is moved in the XY directions and rotated such that the pickup points of the two suction nozzles are positioned on two straight lines extending in the tape feeding direction of each tape feeder passing through an ideal pickup point of the leading components of the two tape feeders, and the leading components are fed to the component pickup positions that are the pickup points of the suction nozzles on the two straight lines by performing tape feeding operation of the two tape feeders, it is possible to pick up the components at two component pickup positions simultaneously by lowering the two suction nozzles simultaneously, thereby improving productivity.

With the present disclosure, position data of multiple suction nozzles that is measured in advanced may be memorized on a memory device, and a calculating device may calculate an XY direction movement amount and rotation angle of the rotary head required to move to the component pickup positions of the two tape feeders and a tape feeding amount of the two tape feeders, based on the positions of the ideal pickup points of the leading components of the two tape feeders and the positions of the two suction nozzles obtained by searching for the position data of the two suction nozzles used to pick up the leading components from the two tape feeders from the position data memorized on the memory device. According to this, it is possible to simply and accurately calculate the positions (the two component pickup positions) of the pickup points of the two suction nozzles on the straight lines based on the geometrical positional relationship between the positions of the two pickup nozzles that are to pick up the two components, and the positions of the ideal pickup points of the two leading components, and it is possible to simply and accurately calculate the XY direction movement amount and rotation angle of the rotary head required to move to the two component pickup positions and the tape feeding amount of the two tape feeders.

In this case, the two tape feeders may be feeders with the same tape feeding pitch (component size), feeders for which the tape feeding pitches are different, or feeders that feed components of different sizes to the component pickup positions. For components of different sizes, because the position of the ideal pickup points (center or center of gravity) are deviated from the tape feeding direction, conventionally, it was not possible to pick up two different-sized component simultaneously, but simultaneous pickup of two different-sized components is possible with the present disclosure.

DESCRIPTION OF EMBODIMENTS

Figure 1:
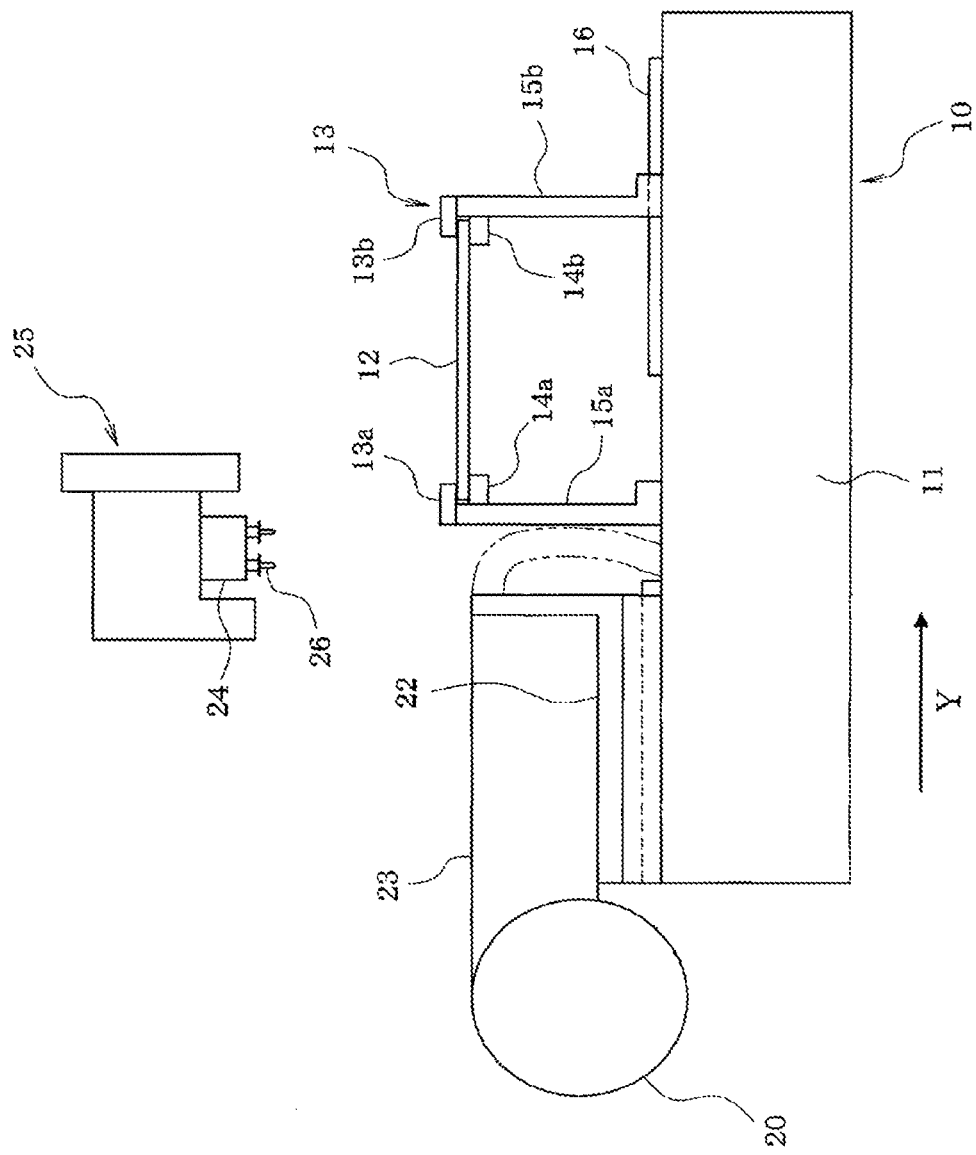
FIG. 1 is a side view of a rotary head type component mounter that is an embodiment of the present disclosure.
Figure 2:
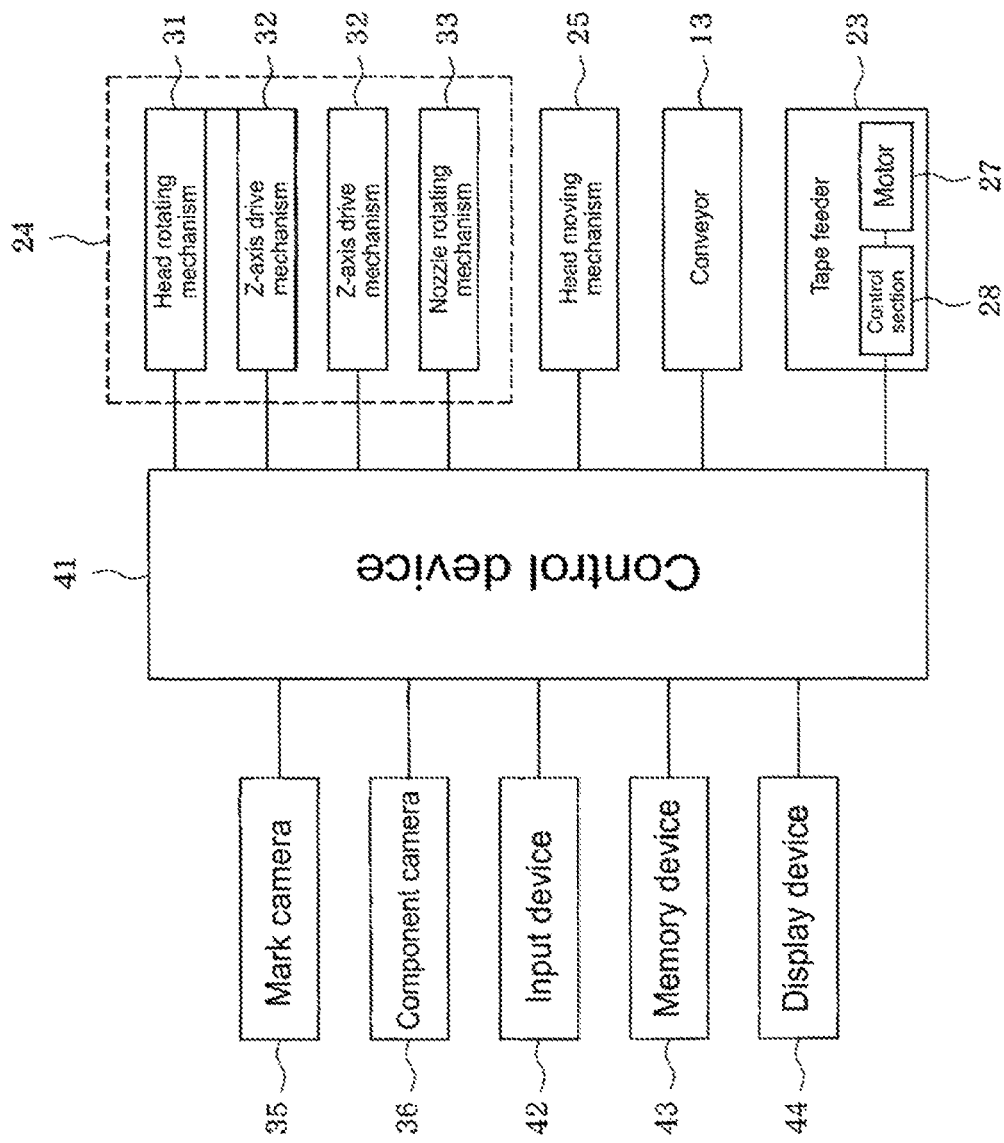
FIG. 2 is a block diagram showing the configuration of control items of the component mounter.

An embodiment of the disclosure is described below. First, the configuration of rotary head type component mounter 10 is described based on FIGS. 1 and 2.

Conveyor 13 that conveys circuit board 12 is provided on base 11 of rotary head type component mounter 10 (below, the conveyance direction of circuit board 12 by conveyor 13 is referred to as the X direction). Of support members 15a and 15b that support the two conveyor rails 13a and 13b and conveyor belts 14a and 14b that configure conveyor 13, support member 15a is fixed at a specified position, with the support member 15b on the opposite side being adjusted in the Y direction (positioned perpendicular to the X direction) along guide rail 16 by a feed screw mechanism (not shown) or the like such that the width of conveyor 13 (the gap between conveyor rails 13a and 13b) is adjustable to the width of circuit board 12.

Further, device pallet 22 (feeder setting table) is detachably attached on base 11 to the side of conveyor 13, with multiple tape feeders 23 being detachably set on device pallet 22 in the Y direction. Reel 20 on which is wound component supply tape that stores many components in a row at a regular pitch is set on each tape feeder 23, sprocket holes formed along the edges of the component supply tape pulled out from reel 20 in the Y direction engage with teeth of a sprocket (not shown), and by tape feeding operation in the Y direction caused by rotation of the sprocket, a component in the component supply tape is fed to a component pickup position (a position at which suction nozzle 26 picks up the component). With each tape feeder 23, it is possible to finely adjust the feeding amount of the component supply tape (the rotation angle of the sprocket) by controlling the rotation angle of motor 27 that rotates the sprocket using control section 28.

Head moving mechanism 25 that moves rotary head 24 in the XY directions between a component pickup station at which component pickup operation is performed and a component mounting station at which component mounting operation is performed is attached to component mounter 10. Multiple suction nozzles 26 that pick up a component fed to the component pickup position by tape feeder 23 are held on rotary head 24 at a specified interval (regular pitch) in a circumferential direction. Rotary head 24 is provided with head rotating mechanism 31 that revolves the multiple suction nozzles 26 in a circumferential direction of rotary head 24 by rotating (on its own axis) rotary head 24 around its own central axis (R axis), Z-axis drive mechanism 32 that causes suction nozzle 26 to pick up a component by lowering the suction nozzle 26 at a specified stopping position (above the component pickup position) on the revolution path of the suction nozzles 26, and nozzle rotating mechanism 33 that corrects the direction of a component picked up by suction nozzle 26 by rotating (on its own axis) suction nozzle 26 around its own center axis.

Figure 3:
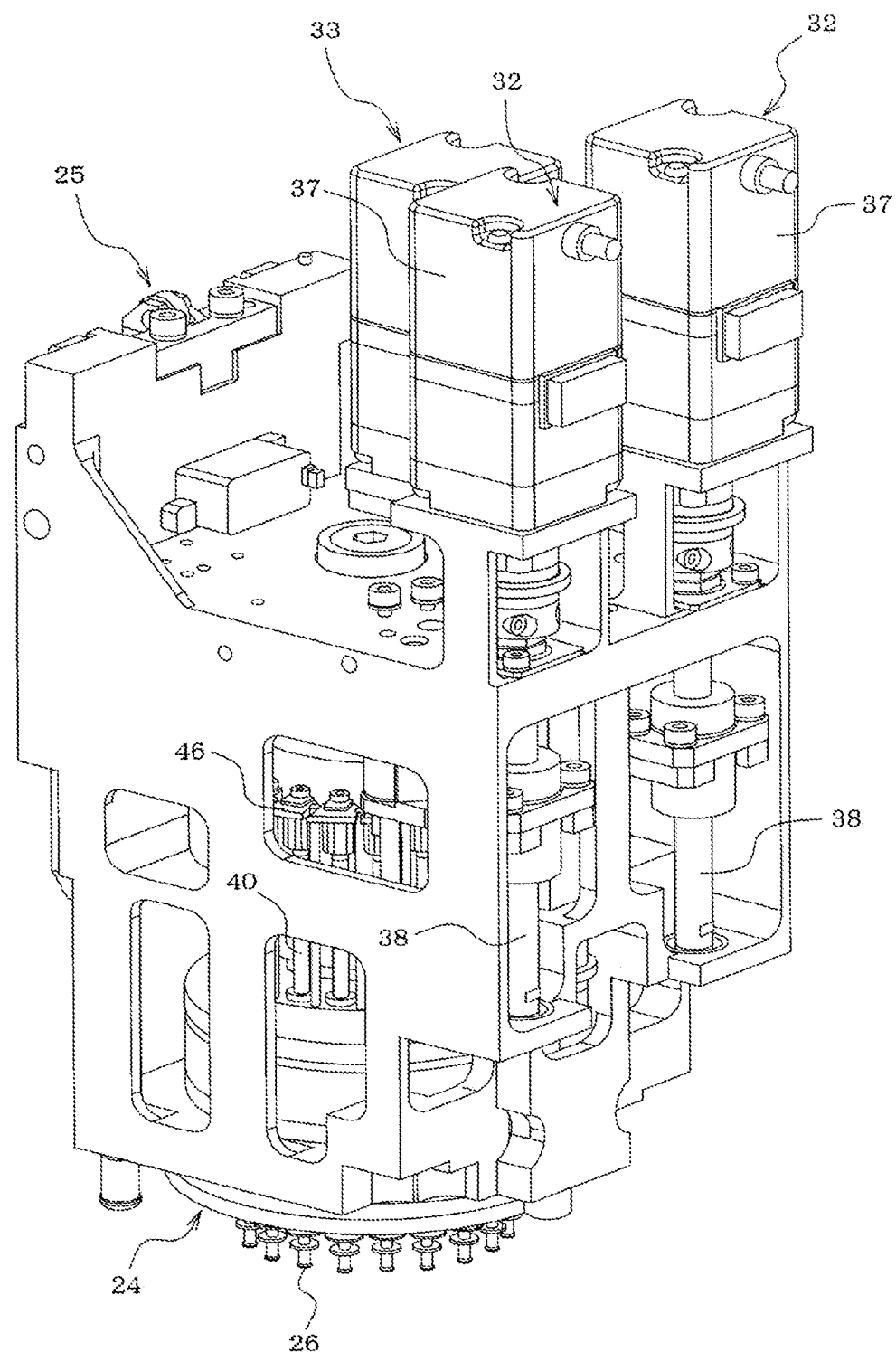
FIG. 3 is a perspective view of an entire rotary head.
Figure 4:
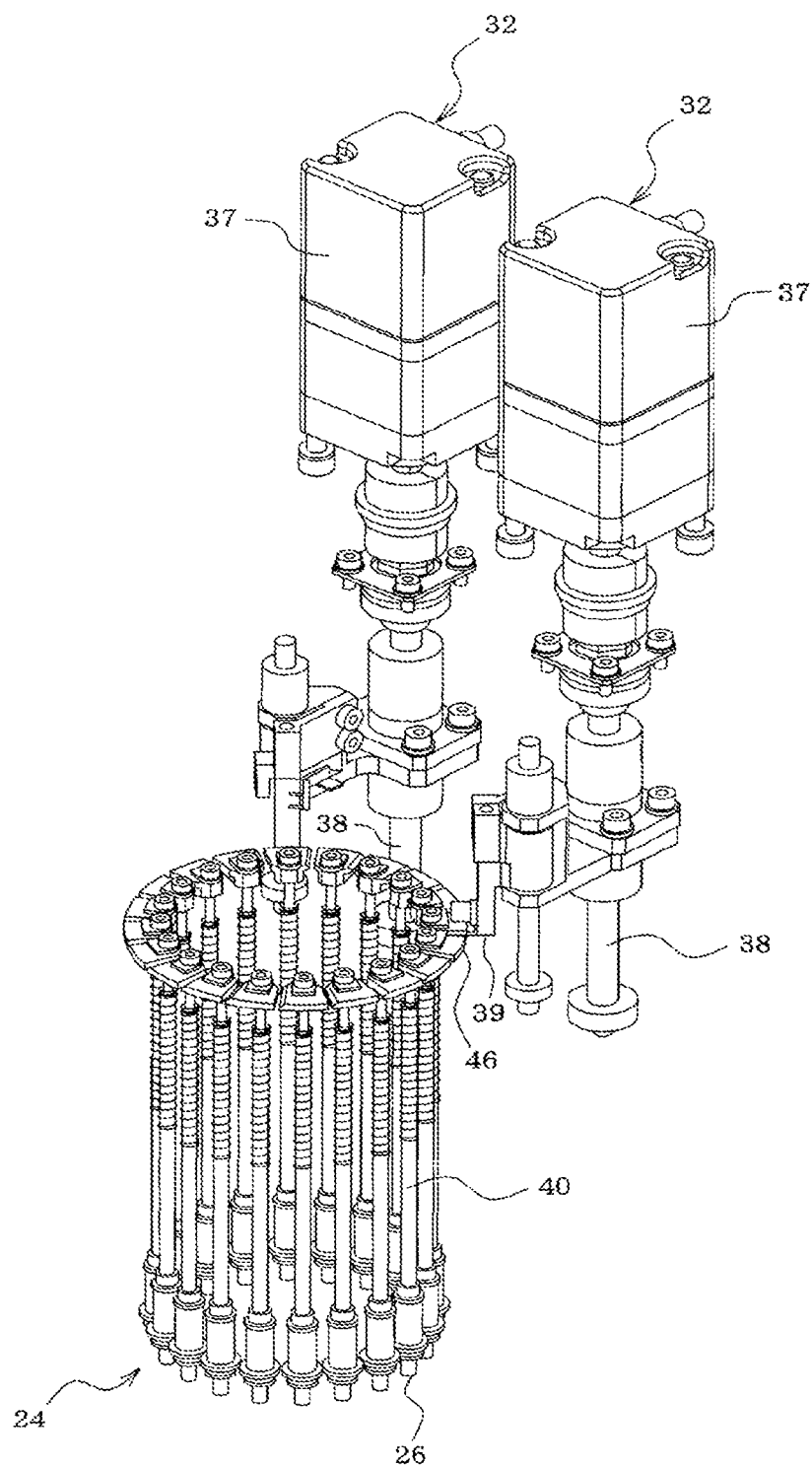
FIG. 4 is a perspective view showing the positional relationship between the Z-axis drive mechanism and the nozzle holders (suction nozzles) of the rotary head.
Figure 5:
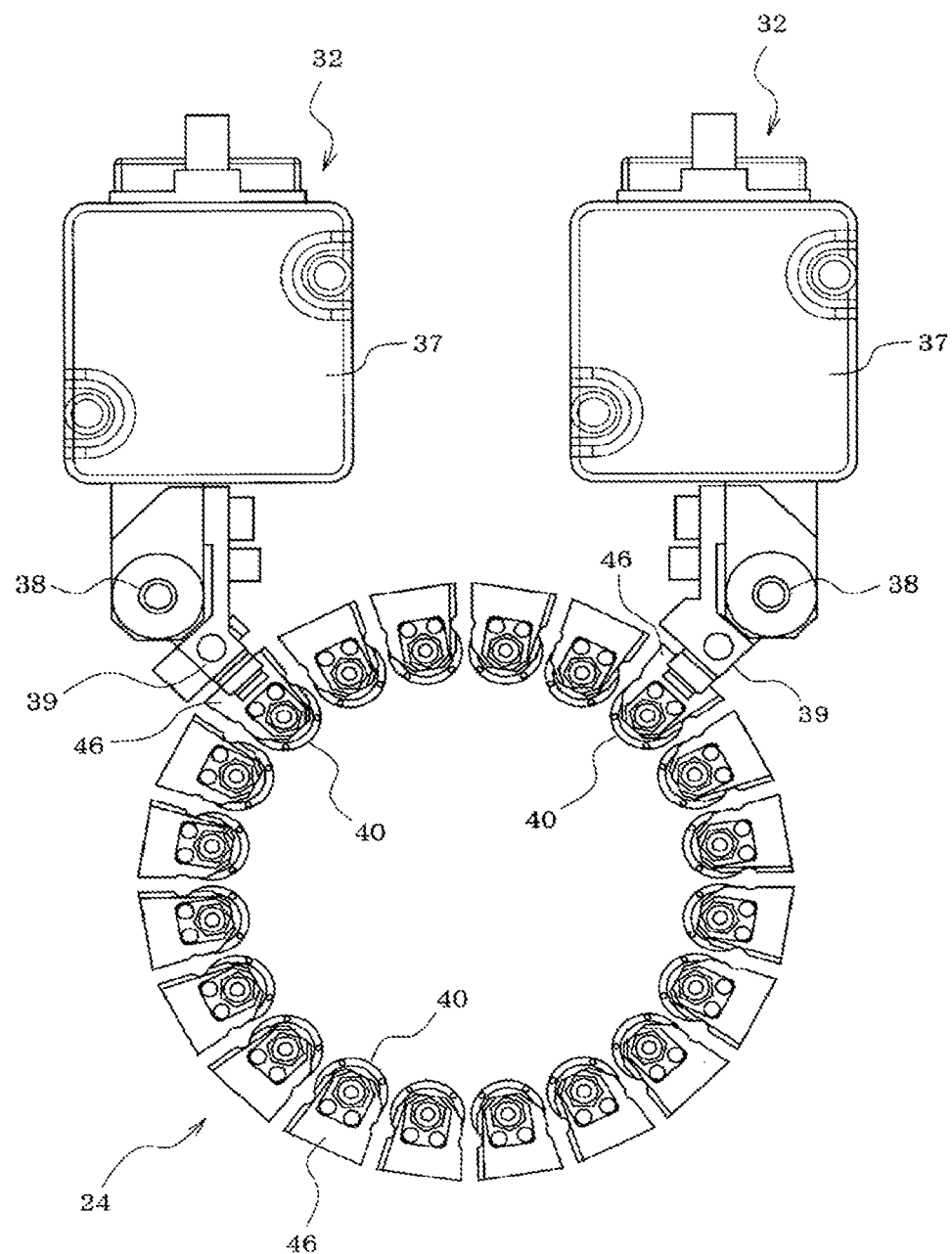
FIG. 5 is a plan view showing the positional relationship between the Z-axis drive mechanism and the nozzle holders of the rotary head.

In the present embodiment, as shown in FIGS. 3 to 5, two Z-axis drive mechanisms 32 are provided at two locations surrounding rotary head 24, with the leading components of two tape feeders 23 being able to be simultaneously picked up by two suction nozzles 26 by the suction nozzles 26 being lowered simultaneously by the two Z-axis drive mechanisms 32.

Each Z-axis drive mechanism 32 uses Z-axis motor 37 as an actuator, and by feed screw 38 being rotated by this Z-axis motor 37 such that Z-axis slide 39 is moved up and down, Z-axis slide 39 engages with engaging member 46 provided at the top end of nozzle holder 40 of rotary head 24, which raises and lowers nozzle holder 40, thus raising and lowering suction nozzle 26 held on the lower section of the nozzle holder 40. Note that, Z-axis slide 39 may be moved up and down by a linear motor acting as Z-axis motor 37. Alternatively, instead of a linear motor, a linear solenoid, an air cylinder, or the like may be used.

Also, component mounter 10 is provided with mark camera 35 (camera for imaging marks) that images reference position marks of circuit board 12 from above by being moved as one with rotary head 24, and component camera 36 (camera for imaging components) that images a component picked up by suction nozzle 26 from below.

Connected to control device 41 of component mounter 10 are, for example, input device 42 such as a keyboard, mouse, or touchscreen panel; memory device 43 (memory device) including a hard disk, RAM, ROM and so on for memorizing various types of programs, data, and the like; and display device 44 such as a liquid crystal display or CRT.

During operation of component mounter 10, operation is repeated such that, after component pickup operation has been performed by moving rotary head 24 to the component pickup station using head moving mechanism 25, component mounting operation is performed by moving rotary head 24 to the component mounting station and mounting the component on circuit board 12. At the component pickup station, components stored in component supply tape are fed to the component pickup positions by feeding operation of the component supply tape of two tape feeders 23, the components are picked up simultaneously by the two suction nozzles 26 positioned above the component pickup positions being lowered simultaneously, and then the two suction nozzles 26 are raised to their original heights, these operations being repeated such that components are picked up in order by the multiple suction nozzles 26 held by nozzle holders 40 of rotary head 24. Here, the two tape feeders 23 may be feeders with the same tape feeding pitch (component size), or, as in the present embodiment, two tape feeders 23 that perform simultaneous pickup with different tape feeding pitches, and that feed components of different sizes to the component pickup positions.

Figure 7:
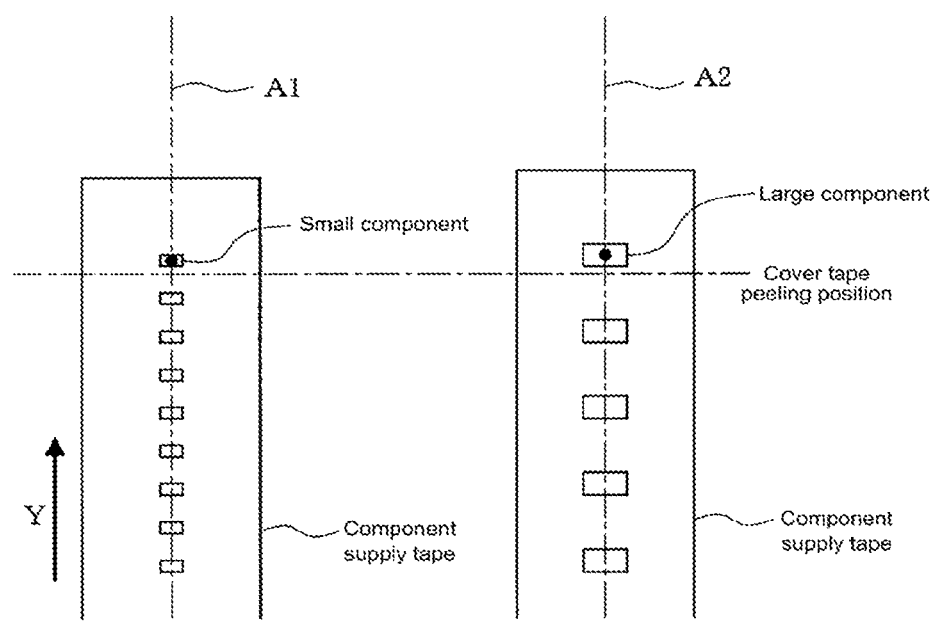
FIG. 7 is a plan view illustrating positional deviation of the leading components of component supply tapes set in two tape feeders.

If the component pickup positions are deviated during component pickup operation, a component pickup error is more likely to occur. In particular, in a case in which the tape feeding pitch of the two tape feeders 23 is different and components of different sizes are fed to the component pickup positions, the position of the ideal pickup point (stable pickup point) of the leading components of the two tape feeders 23 are deviated in the Y direction. As shown in FIG. 7, even if the sizes of the components of component supply tape fed by the two tape feeders 23 is different, and the tape feeding pitch is different, because the peeling positions (Y coordinate) of the cover tape (top tape) that is on the component supply tape are the same, for two components of different sizes, the position of the ideal pickup points is deviated in the Y direction, that is, the tape feeding direction. It is necessary to correct the component pickup position of two components for which the position deviates as given above when performing simultaneous pickup.

Thus, with the present embodiment, control device 41 of component mounter 10, before performing component pickup operation, controls rotation operation and movement in the XY direction of rotary head 24, and tape feeding operation of the two tape feeders 23, to correct the two component pickup positions used for simultaneous pickup as described below. Here, the ideal pickup point (stable pickup point) of a component is generally considered to be the center of the component or the center of gravity of the component, which is the pickup point at which the component can be picked up stably by suction nozzle 26.

As preparation, in advance, the positions of the multiple suction nozzles 26 held by rotary head 24 are measured by image recognition technology or the like, and the measurement data of the position of each suction nozzle 26 is memorized in memory device 43. Then, first, as shown in FIG. 6, rotary head 24 is moved in the XY directions by head moving mechanism 25 and rotated by head rotating mechanism 31 such that the pickup points of the two suction nozzles 26 are positioned on the two straight lines A1 and A2 extending in the tape feeding direction (Y direction) of each tape feeder 23 passing through the ideal pickup points (stable pickup points) of the leading components of the two tape feeders 23, and the leading components are fed to component pickup positions C1 and C2 that are the pickup points of the suction nozzles 26 on the two straight lines A1 and A2.

The specific correction method for component pickup positions C1 and C2 involves control device 41 (calculating device) searching for the measurement data of the position of the two suction nozzles 26 used to pick up the leading components of the two tape feeders 23 from the measurement data of the positions of the multiple suction nozzles 26 memorized in memory device 43, and then calculating the rotation angle and movement amount in the XY directions of rotary head 24 required to move to the component pickup positions of the two tape feeders 23 and the feeding amount of the two tape feeders 23, calculations being based on the positions of the two suction nozzles and the positions of the ideal pickup points of the leadings components of the two tape feeders 23.

That is, if the position of each suction nozzle 26 is known in advance, the gap between the two suction nozzles 26 used for simultaneous pickup is known, therefore component pickup positions C1 and C2 that are the pickup points of the two suction nozzles 26 on the two straight lines A1 and A2 are determined based on the geometrical positional relationship between the gap between the two straight lines A1 and A2 extending in the tape feeding direction (Y direction) passing through the ideal pickup points of the leading components of the two tape feeders 23, and the gap between the pickup points of the two suction nozzles 26. Further, if the component pickup positions C1 and C2 are determined, because the position on the rotation path of suction nozzles 26 of rotary head 24 are thus determined unambiguously, the position of the rotation center of rotary head 24 is also determined unambiguously. From this, the movement amount in the XY directions of rotary head 24 required for simultaneous pickup of the components at component pickup positions C1 and C2 can be calculated, and the rotation angle of rotary head 24 required for simultaneous pickup of the components at component pickup positions C1 and C2 can be calculated from the position of the rotation center of rotary head 24, the current position of the two suction nozzles 26, and the component pickup positions C1 and C2 on straight lines A1 and A2. And, the tape feeding amount of the two tape feeders 23 required for simultaneous pickup of the components at component pickup positions C1 and C2 can be calculated from the current positions of the leading components in the two tape feeders 23 and component pickup positions C1 and C2 on straight lines A1 and A2. Note that, the rotation center (turning circle of suction nozzles 26) of rotary head 24 and the position information of the ideal pickup points of the components may be memorized in advance on memory device 43.

Figure 6:
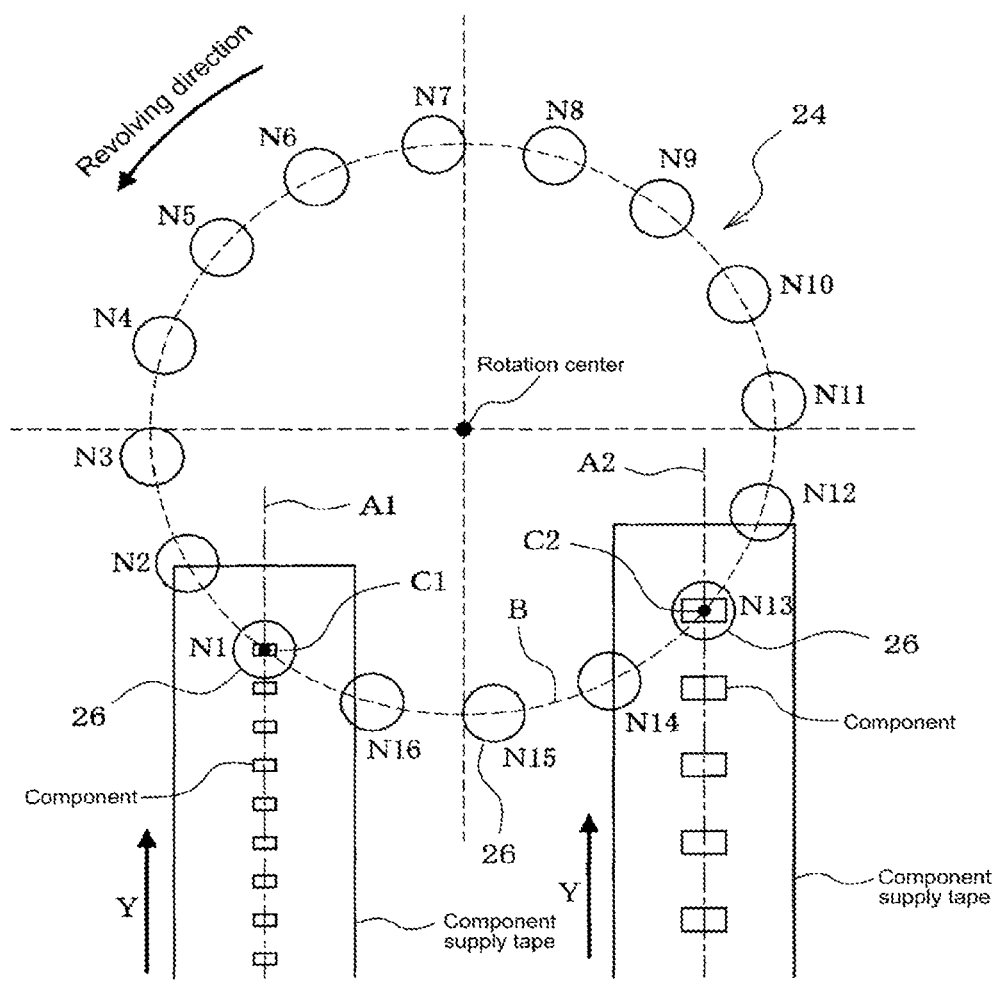
FIG. 6 is a plan view showing the positional relationship between the component pickup positions of two tape feeders and the suction nozzles of the rotary head.

In the example configuration of FIG. 6, a total of sixteen suction nozzles 26 (N1 to N16) are held on rotary head 24 arranged at a pitch of 22.5 degrees in a circumferential direction, the configuration being such that three suction nozzles 26 are positioned between component pickup positions C1 and C2 of the two tape feeders 23. That is, the gap between the two tape feeders 23 that pick up the components is set as the gap of the four angle pitch (22.5 degrees×4=90 degrees) of rotary head 24.

With regard to the order in which components are picked up by the sixteen suction nozzles 26 (N1 to N16), first, rotary head 24 is moved in the XY directions by head moving mechanism 25 and rotated by head rotating mechanism 31 such that the pickup points of the two suction nozzles 26 are positioned on the two straight lines A1 and A2 extending in the tape feeding direction (Y direction) of each tape feeder 23 passing through the ideal pickup points of the leading components of the two tape feeders 23, and the leading components of the component supply tape are fed to component pickup positions C1 and C2 that are the pickup points of the suction nozzles 26 on the two straight lines A1 and A2.

Following this position correcting operation, after the two suction nozzles 26 (N1 and N13) positioned above component pickup positions C1 and C2 of the two tape feeders 23 have been lowered simultaneously to pick up the two components simultaneously, rotary head 24 is rotated by one pitch (22.5 degrees), the next two suction nozzles 26 (N2 and N14) are positioned above component pickup positions C1 and C2, and those two suction nozzles 26 (N2 and N14) pick up the next two component simultaneously. Here, if it is necessary to perform correction again on the positions of the two suction nozzles 26 (N2 and N14) and component pickup positions C1 and C2, the rotation angle and movement amount in the XY directions of rotary head 24 required for the correction, and the tape feeding amount of the two tape feeders 23 are calculated using the above method, and correction is performed again on component pickup positions C1 and C2 by performing rotation operation and XY direction movement operation of rotary head 24 and tape feeding operation of tape feeders 23.

Hereafter, in a similar manner, rotary head 24 is rotated by one pitch (22.5 degrees) (performing the above position correction operation as necessary), and the next two suction nozzles 26 (N3 and N15) pick up the next two components simultaneously; then, rotary head 24 is rotated by one pitch (22.5 degrees) (performing the above position correction operation as necessary), and the next two suction nozzles 26 (N4 and N16) pick up the next two components simultaneously.

After this, rotary head 24 is rotated by a five angle pitch (22.5 degrees×5=112.5 degrees) (performing the above position correction operation as necessary), and the next two suction nozzles 26 (N9 and N5) pick up the next two components simultaneously; then, rotary head 24 is rotated by one pitch (22.5 degrees) (performing the above position correction operation as necessary), the next two suction nozzles 26 (N10 and N6) are positioned above the component pickup positions C1 and C2, and two components are picked up simultaneously by those two suction nozzles (N10 and N6). Hereafter, in a similar manner, rotary head 24 is rotated by one pitch (22.5 degrees) (performing the above position correction operation as necessary), and the next two suction nozzles 26 (N11 and N7) pick up the next two components simultaneously; then, rotary head 24 is rotated by one pitch (22.5 degrees) (performing the above position correction operation as necessary), and the next two suction nozzles 26 (N12 and N8) pick up the next two components simultaneously. By this, component pickup operation is complete for the total of sixteen suction nozzles 26 (N1 to N16) held on rotary head 24.

According to the embodiment described above, because rotary head 24 is moved in the XY directions and rotated such that the pickup points of the two suction nozzles 26 are positioned on the two straight lines A1 and A2 extending in the tape feeding direction (Y direction) of each tape feeder 23 passing through the ideal pickup points of the leading components of the two tape feeders 23, and feeding position correction operation performed such that the leading components of the two component feeders 23 are fed to component pickup positions C1 and C2 that are the pickup points of the suction nozzles 26 on the two straight lines A1 and A2, even if the positions of the leading components of the component supply tape set in the two tape feeders 23 is deviated, or if the positions of the two suction nozzles 26 to be used to pick up those components is deviated, after the position correction operation, the two suction nozzles 26 can be lowered simultaneously to pick up two components at the component pickup positions C1 and C2, thereby improving productivity.

By performing the above position correction operation, even if the two tape feeders 23 have different tape feeding pitches (component sizes), it is possible to pick up the two components simultaneously using the two suction nozzles 26, and, even if the position of each suction nozzle 26 is irregular, it is possible to pick up the two components simultaneously using the two suction nozzles 26.

Note that, the present disclosure is not limited to the configuration of the above embodiments, and various changes may be made without departing from the scope, such as, the quantity of suction nozzles 26 may be changed, or the configuration of component mounter 10 may be changed.

REFERENCE SIGNS LIST

10: rotary head type component mounter; 12: circuit board; 13: conveyor; 23: tape feeder; 24: rotary head; 25: head moving mechanism; 26: suction nozzle; 31: head rotating mechanism; 32: Z-axis drive mechanism; 33: nozzle rotating mechanism; 27: Z-axis motor; 39: Z-axis slide; 40: nozzle holder; 41: control device (calculating device); 43: memory device (memory device); 46: engaging member

The invention claimed is:

1. A component pickup position correction system of a rotary head type component mounter, the system comprising:

multiple tape feeders configured to feed a component stored in component supply tape to a component pickup position by performing feeding operation of the component supply tape;

a rotary head configured to hold multiple suction nozzles at a specified interval in a circumferential direction;

a head rotating mechanism configured to revolve the multiple suction nozzles in the rotation direction of the rotary head by rotating the rotary head;

a Z-axis drive mechanism configured to cause pickup of the component by lowering the suction nozzle that is positioned above the component pickup position of one of the multiple tape feeders;

a head moving mechanism configured to move the rotary head in XY directions between a component pickup station at which component pickup operation is performed and a component mounting station at which component mounting operation is performed; and processing circuitry configured to correct the component pickup positions, wherein the Z-axis drive mechanism is provided in two locations, and is configured to simultaneously pickup leading components in two of the multiple tape feeders by simultaneously lowering two suction nozzles of the multiple suction nozzles that are positioned above the component pickup positions of the two of the multiple tape feeders, and the processing circuitry corrects the component pickup positions of the leading components of the two tape feeders by:

moving the rotary head in the XY directions with the head moving mechanism and rotating the rotary head with the head rotating mechanism such that pickup points of the two suction nozzles are positioned on two straight lines extending in a tape feeding direction of each of the two tape feeders, calculating corrected tape feeding amounts of each of the two tape feeders to supply the leading components of each of the two tape feeders to the pickup points of the two suction nozzles on the two straight lines, and feeding the leading components of the two tape feeders with the corrected tape feeding amounts to the component pickup positions that are the pickup points of the suction nozzles on the two straight lines.

2. The component pickup position correcting system of a rotary head type component mounter according to claim 1, further comprising:

a memory device on which is memorized position data of multiple suction nozzles that is measured in advanced, wherein the processing circuitry calculates an XY direction movement amount and rotation angle of the rotary head required to move to the component pickup positions of the two tape feeders and the tape feeding amounts of the two tape feeders, based on positions of ideal pickup points of the leading components of the two tape feeders and the positions of the two suction nozzles obtained by searching for the position data of the two suction nozzles used to pick up the leading components from the two tape feeders from the position data memorized on the memory device.

3. The component pickup position correcting system of a rotary head type component mounter according to claim 1, wherein the two tape feeders have a different tape feeding pitch to each other, and feed components of different sizes to the component pickup positions.

4. The component pickup position correcting system of a rotary head type component mounter according to claim 1, wherein the two tape feeders each includes a motor that rotates a sprocket and tape feeding amounts of the two tape feeders are varied by controlling the motor.

5. A component pickup position correction method of a rotary head type component mounter, the method comprising:

feeding a component stored in component supply tape to a component pickup position by performing feeding operation of the component supply tape using multiple tape feeders;

holding multiple suction nozzles at a specified interval in a circumferential direction on a rotary head;

revolving, the multiple suction nozzles in the rotation direction of the rotary head by rotating the rotary head using a head rotating mechanism;

using a Z-axis drive mechanism to pick up the component by lowering the suction nozzle that is positioned above the component pickup position of one of the multiple tape feeders;

using a head moving mechanism to move the rotary head in XY directions between a component pickup station at which component pickup operation is performed and a component mounting station at which component mounting operation is performed, using the Z-axis drive mechanism, which is provided in two locations, to simultaneously pickup leading components in two tape feeders of the multiple tape feeders by simultaneously lowering two suction nozzles of the multiple suction nozzles that are positioned above the component pickup positions of the two tape feeders, and, correcting the component pickup positions of the leading components of the two tape feeders, by:

moving the rotary head in the XY directions using the head moving mechanism and rotating the rotary head with the head rotating mechanism such that pickup points of the two suction nozzles are positioned on two straight lines extending in a tape feeding direction of each of the two tape feeders, calculating corrected tape feeding amounts of each of the two tape feeders to supply the leading components of each of the two tape feeders to the pickup points of the two suction nozzles on the two straight lines, and feeding the leading components of the two tape feeders with the corrected tape feeding amounts to the component pickup positions that are the pickup points of the two suction nozzles on the two straight lines.

* * * * *